US005122477A

United States Patent [19]

Wolters et al.

[11] Patent Number: 5,122,477

[45] Date of Patent: Jun. 16, 1992

[54] METHOD OF MANUFACTURING A SEMICONDUCTOR DEVICE COMPRISING CAPACITORS WHICH FORM MEMORY ELEMENTS AND COMPRISE A FERROELECTRIC DIELECTRIC MATERIAL HAVING MULTILAYER LOWER AND UPPER ELECTRODES

[75] Inventors: Robertus A. M. Wolters; Mathieu J. E. Ulenaers, both of Eindhoven, Netherlands

[73] Assignee: U.S. Philips Corporation, New York, N.Y.

[21] Appl. No.: 661,030

[22] Filed: Feb. 25, 1991

[30] Foreign Application Priority Data

Mar. 16, 1990 [NL] Netherlands ........................ 9000602

[51] Int. Cl.[5] ........................................ H01L 21/441

[52] U.S. Cl. .................................... 437/60; 437/192; 437/195; 437/201; 437/978

[58] Field of Search ...................... 437/42, 47, 52, 60, 437/192, 195, 201, 919, 978; 148/DIG. 14, DIG. 43; 29/25.42; 361/313; 365/145

[56] References Cited

U.S. PATENT DOCUMENTS 3,657,029 4/1972 Fuller ................................ 437/192
4,423,087 12/1983 Howard et al. .................... 361/305
4,437,139 3/1984 Howard ............................. 437/978
4,707,897 11/1987 Rohrer et al. ...................... 29/25.42
5,005,102 4/1991 Larson .............................. 29/25.42

*Primary Examiner*—Brian E. Hearn
*Assistant Examiner*—C. Chaudhari
*Attorney, Agent, or Firm*—Paul R. Miller

[57] ABSTRACT

A method of manufacturing a semiconductor device comprising a semiconductor body (3) with a surface (10) on which capacitors (2) are provided, which form memory elements, with a lower electrode (11) including platinum, a ferroelectric dielectric material (12) and an upper electrode (13) is presented. In the method according to the invention, the electrodes (11, 13) including platinum are formed by the successive deposition on a surface of a first layer (19, 26) comprising a metal from the group titanium, zirconium, hafnium or an alloy of these metals, a second layer (20, 27) comprising platinum, and a third layer (21, 28) comprising a metal from the group titanium, zirconium, hafnium, or an alloy of these metals, upon which the semiconductor body is heated in an atmosphere containing oxygen. The first metal layer ensures a good adhesion of the electrode, the second layer acts as the electrode proper, while the third metal layer counteracts adverse effects of the first layer. Semiconductor devices having electrodes with good adhesion and a smooth surface can be manufactured in such a way. As a result, the semicondcutor device is reliable, while switching of the capacitors (2) acting as memory elements between two polarization states takes place at a positive and a negative voltage of equal value.

11 Claims, 3 Drawing Sheets

METHOD OF MANUFACTURING A SEMICONDUCTOR DEVICE COMPRISING CAPACITORS WHICH FORM MEMORY ELEMENTS AND COMPRISE A FERROELECTRIC DIELECTRIC MATERIAL HAVING MULTILAYER LOWER AND UPPER ELECTRODES

The invention relates to a method of manufacturing a semiconductor device comprising a semiconductor body with a surface on which capacitors are provided, which capacitors form memory elements and comprise a lower electrode comprising platinum, a ferroelectric dielectric material, and an upper electrode.

Ferroelectric materials possess electrical properties which are analogous to magnetic properties of ferromagnetic materials. If an electric field is applied across a ferroelectric material and removed again, a remanent polarization of the material is the result. The memory element referred to above, formed by a capacitor comprising a ferroelectric material by way of dielectric material, forms a nonvolatile memory element. When a voltage is applied across the capacitor and removed again—or, in other words, a voltage pulse is applied—a remanent polarization results in the ferroelectric material. The remanent polarization is reversed by the application of an equally large voltage pulse of reversed polarity across the capacitor. In this way it is possible to switch up and down between two stable polarization states by means of voltage pulses. The ferroelectric material is provided between the electrodes in such a thickness that switching up and down between the two polarization states is possible with comparatively low voltage pulses, while in addition the capacitor has such a capacitance that detection of the charging current is possible and breakdown during operation is avoided. Besides the capacitors, detection and read-in and read-out circuits are provided in the semiconductor body, so that an electronic memory is formed which may be used in, for example, computers.

BACKGROUND OF THE INVENTION

A method of the kind described in the opening paragraph is known from European Patent Application No. EP-A 0 338 157, according to which the capacitor is formed in that the following materials are successively provided and given the correct shape on the surface of a silicon body: a first layer of platinum used as a lower electrode, a layer of ferroelectric material used as a dielectric material, and a second layer of platinum used as an upper electrode. A perovskite-type material is used as the ferroelectric material, such as lead-zirconium titanate.

For reasons of economy the tendency is to realise as many memory elements as possible per unit area on a semiconductor body. This means in practice that the space on the semiconductor body must be utilized as efficiently as possible. For this purpose, the capacitor must have comparatively small dimensions with the thinnest possible dielectric material. When platinum is provided on silicon oxide or nitride, the lower electrode shows insufficient adhesion to the surface. It is also found that contamination of the thin dielectric material with electrode metal can occur in the known method, and consequently electrical breakdown is possible in the dielectric material. The memory then turns out to be unreliable for these reasons.

SUMMARY OF THE INVENTION

The invention has for its object inter alia to provide a method by which semiconductor devices having reliable memory elements can be realised.

According to the invention, a method of the kind described in the opening paragraph is characterized in that the lower electrode comprising platinum is formed by the successive deposition on the surface of a first layer comprising a metal from the group titanium, zirconium, hafnium, or an alloy of these metals, a second layer comprising platinum, and a third layer comprising a metal from the group titanium, zirconium, hafnium, or an alloy of these metals, upon which the semiconductor body is heated in an atmosphere which contains oxygen.

A metal from the group titanium, zirconium and hafnium has a forming heat for its oxide which is lower than the forming heat of the material of the semiconductor body surface, so that a good adhesion of this metal to the semiconductor surface is obtained through reduction of the semiconductor surface and oxidation of the metal from the group during the heating stage. These metals also form an intermetallic bond with the second layer comprising platinum. Thus the first layer acts as an adhesive layer between the semiconductor surface and the platinum layer. The second layer comprising platinum acts as the electrode metal proper, providing a good electrical conduction, while it is at the same time inert. The third layer comprising a metal from the group titanium, zirconium and hafnium counteracts adverse effects of the first metal layer. The third layer oxidizes during heating in the atmosphere containing oxygen, whereby a smooth, dense, homogeneous insulating layer is formed. This layer ensures that the surface of the lower electrode remains smooth and further acts as a barrier layer for the electrode metal, so that no contamination of the dielectric material with electrode metal occurs. In this way it is possible to provide such a thin layer of ferroelectric material on the lower electrode that a memory element is obtained which can be switched from one into the other state by comparatively low voltage pulses and which has such a high capacitance that it is perfectly possible to detect these switching transitions. The third layer may be very thin ($<10$ nm) in order to obtain the desired effect referred to above. The oxide layer formed from the third layer is thus also very thin and does not appreciably influence the capacitance value.

If the third layer comprising a metal from the group titanium, zirconium and hafnium is omitted, a good adhesion does occur after heating in the atmosphere containing oxygen, but there will also be such a rough surface that the formation of a homogeneous layer of ferroelectric material having a uniform thickness becomes practically impossible, as a result of which large electric fields can be created locally, which give rise to breakdown or degeneration of the dielectric material.

Preferably, the method is characterized in that both the first metal layer and the third metal layer are made of titanium. Titanium reduces silicon oxide at comparatively low temperatures and forms a strong bond with it. Moreover, titanium can be easily deposited on silicon compounds in the semiconductor manufacturing process and it can also be etched away there in a simple manner locally with great selectivity.

The ferroelectric material will usually have to undergo a heat treatment in order to improve the material characteristics. If this heat treatment is combined with the heat treatment of the lower electrode, this has the advantage that the semiconductor device need be exposed to a high temperature for a shorter period. The method, therefore, is preferably characterized in that a ferroelectric dielectric material is provided after deposition of the lower electrode but before the heating stage, after which both the lower electrode and the ferroelectric dielectric material are heated in an atmosphere containing oxygen.

The lower electrode may be etched into a pattern during various production stages. If this happens immediately after the lower electrode has been provided, the disadvantage is that the edges of the lower electrode may change their shape during the next heating stage. It is advantageous, therefore, to etch the lower electrode into a pattern after the heating stage, so that sharply defined edges are formed on the lower electrode. If the etching stage takes place after the ferroelectric dielectric material has been provided, the advantage is that only one process stage is required for patterning the lower electrode and the dielectric material. It is even more advantageous to pattern both the dielectric material and the lower electrode simultaneously after their heat treatment. The capacitor to be formed is then given sharply defined edges. Accordingly, the method is preferably characterized in that the lower electrode and the ferroelectric dielectric material are etched into a pattern after the lower electrode and the ferroelectric dielectric material have been provided and subjected to the heat treatment.

The method, furthermore, is preferably characterized in that, after the lower electrode and the ferroelectric dielectric material have been provided, an upper electrode is provided on the dielectric material by subsequent deposition on the surface of the dielectric material of a first layer comprising a metal from the group titanium, zirconium, hafnium, or an alloy of these metals, a second layer comprising platinum, and a third layer comprising a metal from the group titanium, zirconium, hafnium or an alloy of these metals, upon which the semiconductor body is heated in an atmosphere containing oxygen. In this way an upper electrode is formed which is smooth and has a good adhesion to surfaces such as oxides and nitrides. It is possible in this case to provide contacts between the upper electrodes and, for example, switching electronics in the semiconductor body.

Experiments have shown that, if the same metals are used at the upper and lower surface of the ferroelectric dielectric material, switching of the capacitor between two polarization states takes place at positive and negative voltages of equal value. This simplifies the switching electronics. The method therefore is preferably characterized in that the first metal layer of the upper electrode and the third metal layer of the lower electrode are provided with the same composition.

BRIEF DESCRIPTION OF THE DRAWINGS

The invention is explained in more detail with reference to an example and a drawing. In this drawing.

The Figures are purely diagrammatical and not drawn to scale, in particular the dimensions in the thickness direction being strongly exaggerated. Corresponding parts have generally been given the same reference numerals in the Figures.

DESCRIPTION OF THE INVENTION

Figure 1:
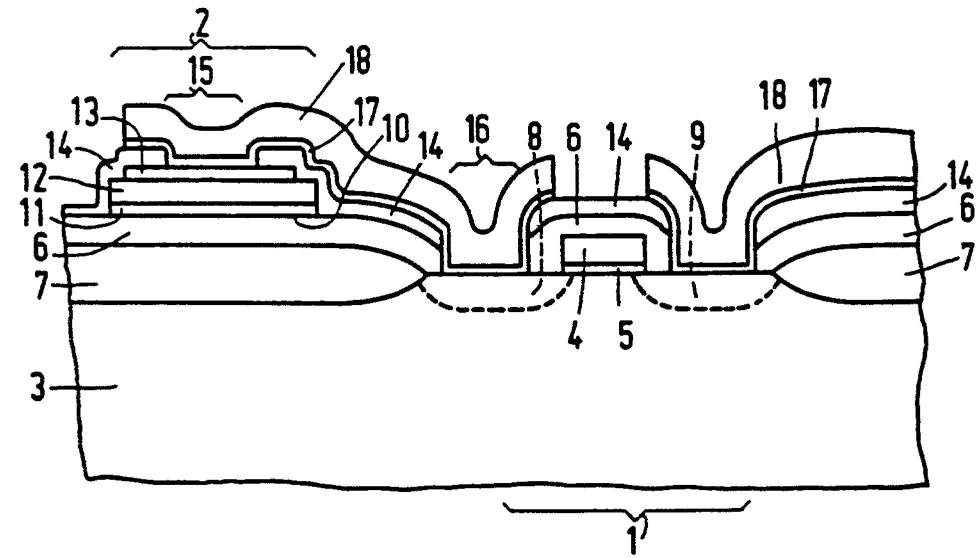
FIG. 1 shows a cross-section of a semiconductor device having a capacitor forming a memory element on a surface and manufactured by the method according to the invention.

FIG. 1 shows a cross-section of a semiconductor device, whose manufacture by the method according to the invention will be described. The semiconductor device comprises a semiconductor body 3 with a surface 10 on which a memory element in the form of capacitor 2 is provided with a lower electrode 11 comprising platinum, a ferroelectric dielectric material 12, and an upper electrode 13. Such a semiconductor device forms a memory element in conjunction with switching electronics. To this end, a switching transistor 1 is connected to a capacitor 2. For the sake of clarity, only one transistor 1 and one capacitor 2 are drawn, but in practice the semiconductor body comprises a great number of such transistors and capacitors. The MOS transistor is provided in usual manner in the silicon semiconductor body 3, with a gate electrode 4 of polycrystalline silicon insulated from the semiconductor body 3 by a layer of silicon oxide 5 having a thickness of approximately 30 nm. The gate electrode 4 is further insulated by a silicon oxide layer 6. Individual transistors are separated from one another by field oxide regions 7. Source and drain regions 8 and 9 of the transistor are made between field oxide 7 and gate electrode 4 by means of diffusion.

The semiconductor further comprises the surface 10 on which the capacitor 2 forming a memory element is provided with a lower electrode 11 comprising platinum, a ferroelectric dielectric material 12, and an upper electrode 13 comprising platinum. The surface of the capacitor 2 is covered by an insulating silicon oxide layer 14. Contact holes 15 and 16 are etched in this oxide layer. The upper electrode 13 is connected to the source region 8 of the transistor 1 by means of metallization layers 17 and 18 via these contact holes. The layer 17 consists of, for example, an alloy of titanium and tungsten, and the layer 18 of an aluminum alloy.

The transistor 1 and the capacitor 2 are connected to switching electronics in the semiconductor body. The lower electrode 11 is connected to a drive line, the gate electrode 4 to a word line, while the drain region 9 is connected to a so-called bit line via metallization layers 17 and 18. It is possible to control the memory element and to switch the ferroelectric dielectric material 12 between two stable polarization states by means of voltage pulses on the various lines.

FIGS. 2 to 9 show stages in the manufacture of the semiconductor device comprising a semiconductor body with a surface 10 on which a memory element in the form of capacitor 2 is provided with a lower electrode 11 comprising platinum, a ferroelectric dielectric material 12, and an upper electrode 13. According to the invention, the lower electrode 11 comprising platinum is formed in that the following materials are deposited successively on the surface: a first layer 19 comprising a metal from the group titanium, zirconium, hafnium, or an alloy of these metals, a second layer 20 comprising platinum, and a third layer 21 comprising a metal from the group titanium, zirconium, hafnium, or an alloy of these metals, upon which the semiconductor body is heated in an atmosphere containing oxygen.

Figure 2:
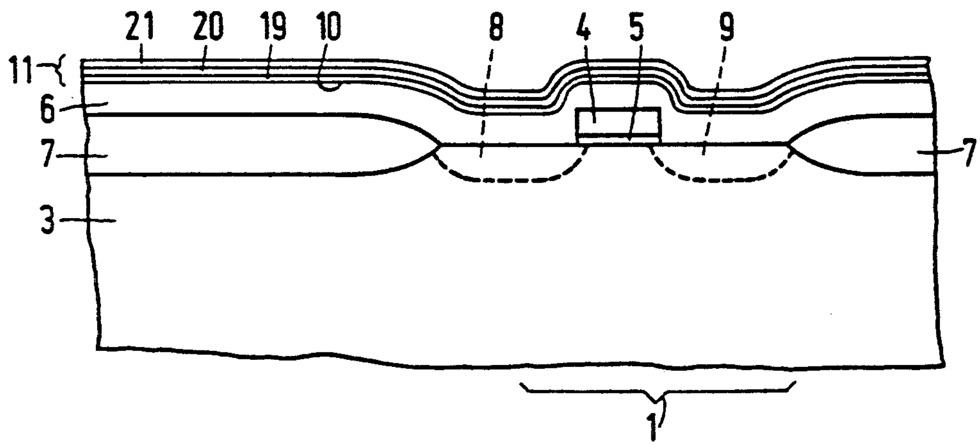
FIGS. 2, 3, 4, 5, 6, 7, 8 and 9 show diagrammatically and in cross-section subsequent stages of manufacture of a semiconductor device by the method according to the invention.
Figure 3:
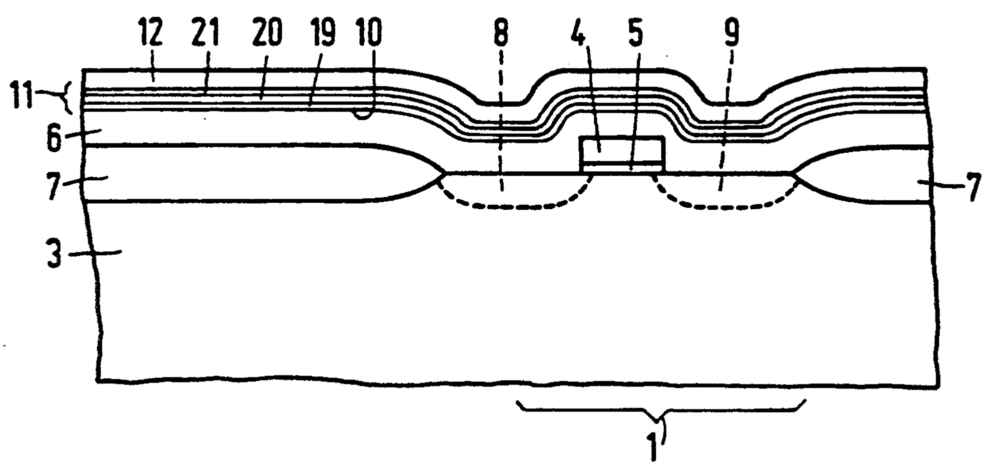
Figure 4:
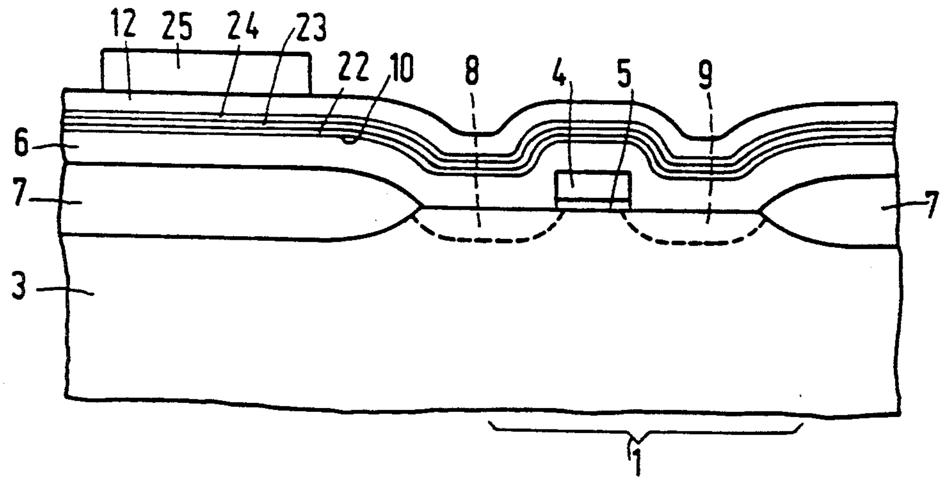
Figure 5:
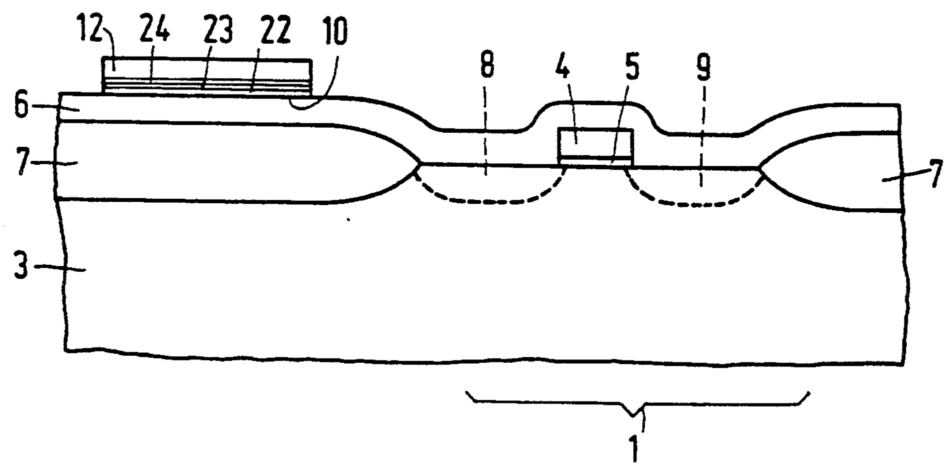
Figure 6:
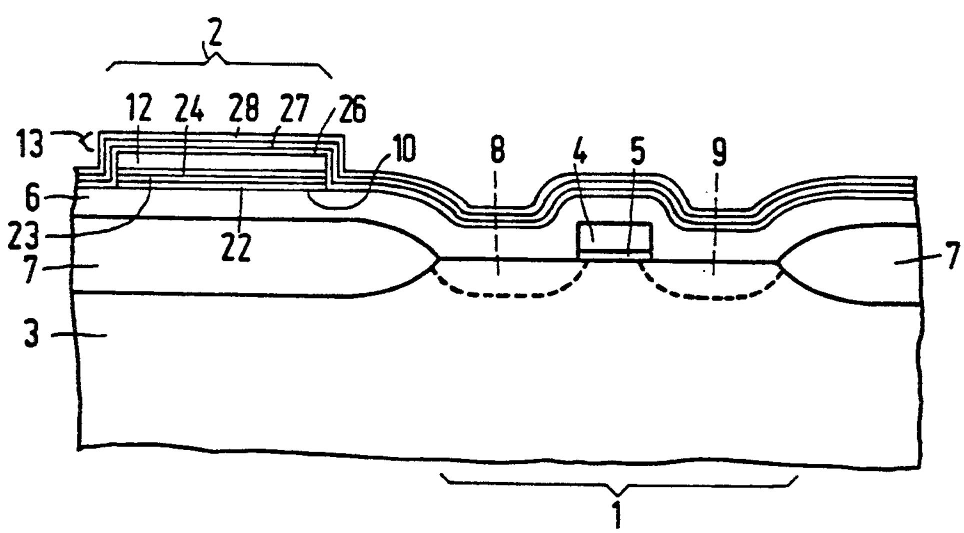
Figure 7:
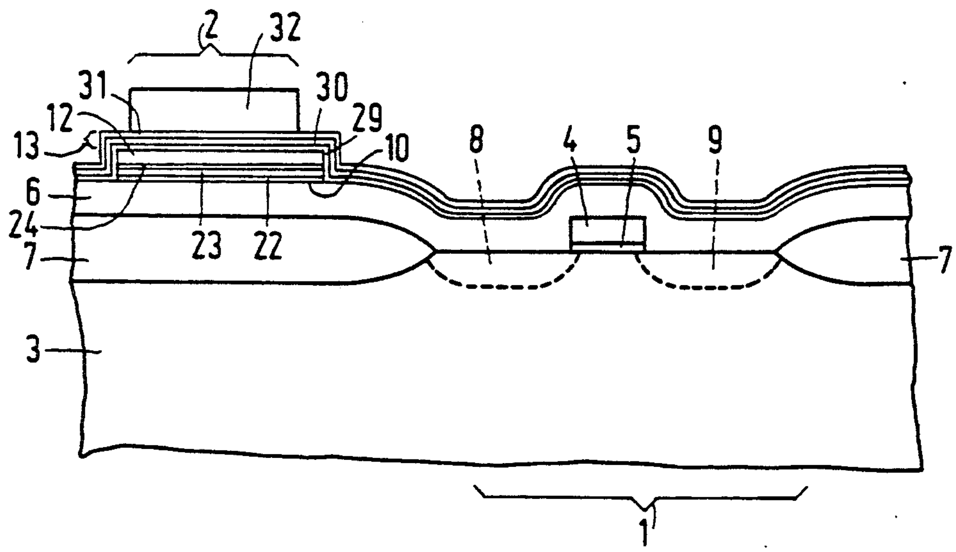
Figure 8:
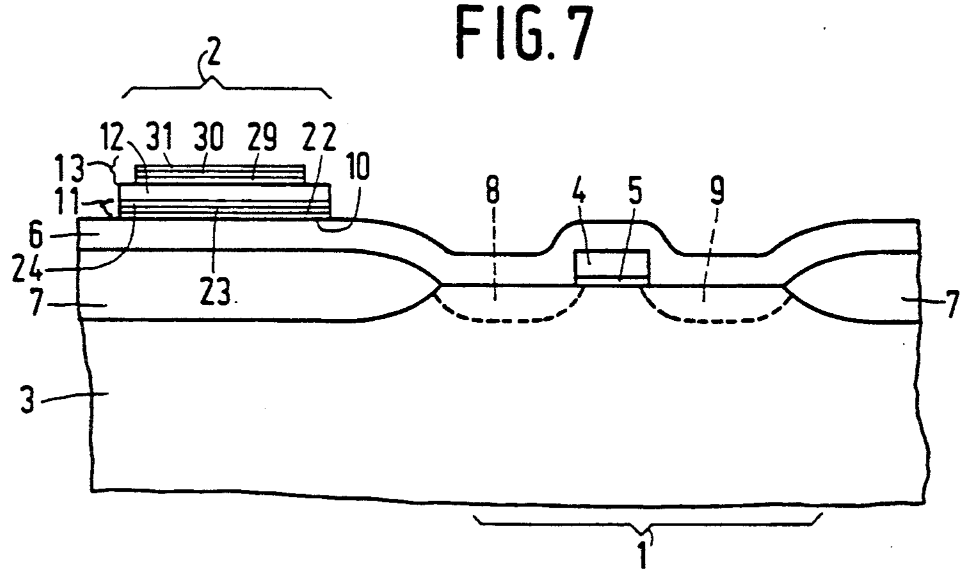
Figure 9:
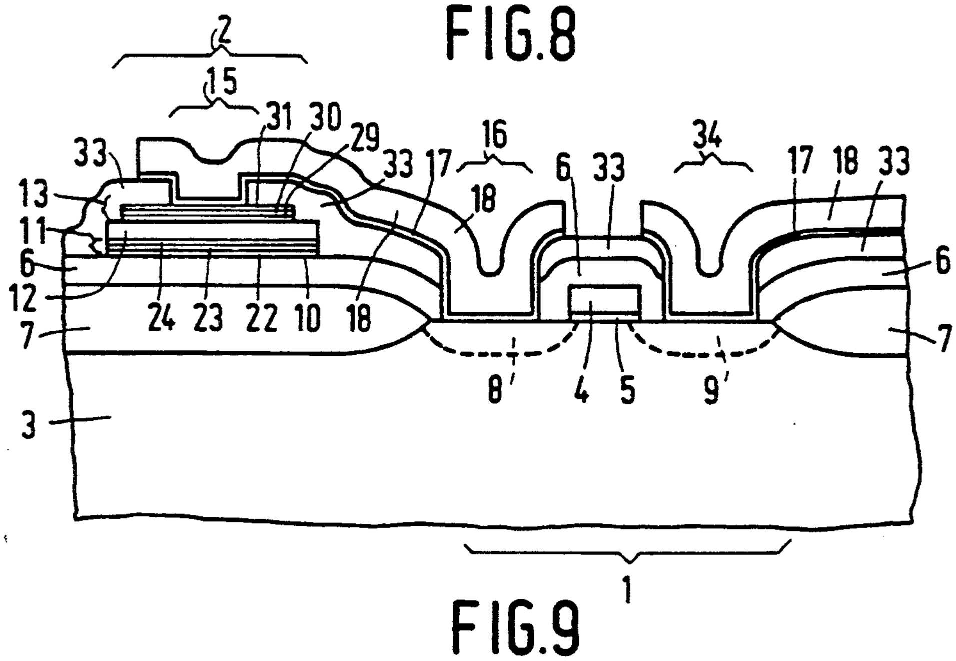

FIG. 2 shows a semiconductor device analogous to that from FIG. 1, but in a stage of manufacture in which the lower electrode 11 has already been provided by a sputtering process, but in which no heat treatment of the lower electrode has taken place yet. Both the first metal layer 19 and the third metal layer 21 are made of titanium. The first layer 19 gives a good adhesion both to the semiconductor surface 10 and to the second layer 20 comprising platinum after a heating treatment. The third layer 21 ensures that an electrode 11 with a smooth surface is formed during the heat treatment. Preferably, a ferroelectric dielectric material is provided (see FIG. 3) after deposition of the lower electrode 11 but before the heating treatment, upon which both the lower electrode and the ferroelectric dielectric material are heated in an atmosphere containing oxygen. Lead-zirconium titanate, for example, is used as the ferroelectric dielectric material 12. It is applied by means of the sol-gel technology. In this technology a solution of lead, zirconium, and titanium precursors is used. usually in the form of acetates or alkoxides, which are suitable for forming an organometallic gel. This gel is provided on the electrode 11 by a spinning process in a centrifuge and then subjected to the heat treatment in an atmosphere containing oxygen. The first layer 19 of titanium (FIG. 3) then reacts with the silicon oxide surface 10, forming titanium oxide 22 there (see FIG. 4). Titanium will diffuse from the layers 19 and 21 into the second layer 20 comprising platinum, so that a $PtTi_x$ layer 23 is formed, in which x is in the order of 0.05. The third layer 21 of titanium oxidizes during the heat treatment, forming a dense, homogeneous, smooth layer of titanium oxide 24. This layer 24 prevents platinum entering the dielectric material 12. After the lower electrode 11 and the ferroelectric dielectric material 12 have been provided and subjected to the heat treatment, the lower electrode and the ferroelectric dielectric material are patterned in that they are locally covered with a photosensitive layer 25 (see FIG. 4) in usual manner and then etched with a reactive plasma. A structure as sketched in FIG. 5 is the result. After lower electrode 11 and ferroelectric dielectric material 12 have been provided, an upper electrode 13 is provided on the dielectric material by the successive deposition on the surface of the dielectric material 12 of a first layer 26 comprising a metal from the group titanium, zirconium, hafnium, or an alloy of these metals, a second layer 27 comprising platinum, and a third layer 28 comprising a metal from the group titanium, zirconium, hafnium, or an alloy of these metals, upon which the semiconductor body is heated in an atmosphere containing oxygen. Preferably, the first metal layer 26 of the upper electrode 13 and the third metal layer 21 of the lower electrode 11 are provided with the same composition. The capacitor 2 will then have a symmetrical voltage characteristic, whereby equally strong positive and negative voltages are required for switching over the polarization state of the dielectric material 12 of the capacitor. In the present example, titanium is provided by a sputtering process on both the first metal layer 26 and the third metal layer 28 of the upper electrode. After a heating stage, a structure as indicated in FIG. 7 is the result. The first layer of titanium 26 is substantially converted into titanium oxide 29 during this, which oxide provides a good adhesion of the upper electrode 13 to the ferroelectric dielectric material 12, while the platinum electrode metal 27 is converted into $PtTi_x$ 30, in which x is approximately 0.05, and the third titanium layer 28 is converted into titanium oxide 31 which provides for a smooth surface of the upper electrode. The upper electrode is etched into a pattern under the mask of a photosensitive layer 32. The result is shown in FIG. 8. FIG. 9 shows how the semiconductor device represented in FIG. 8 can be finished in usual manner, for example, by coating the surface with insulating layer 33, made of, for example, silicon oxide. Contact holes 15, 16 and 34 are etched in this passivating layer 33 for contacting the upper electrode 13 and the source and drain regions 8 and 9, respectively. The titanium oxide present in contact hole 15 is removed by sputter etching. The metallization layer consists of a diffusion barrier layer 17 of an alloy of titanium and tungsten and a conductor layer 18 of an aluminum alloy.

EMBODIMENT 1

In a first example, a lower electrode is provided on a semiconductor substrate and heat-treated in an oxygen-containing atmosphere, upon which a dielectric material is provided and heat-treated in an oxygen-containing atmosphere, and finally an upper electrode is provided and heat-treated in an oxygen-containing atmosphere.

A lower electrode as described above was provided on an Si<100> slice which was provided with an approximately 600 nm thick layer of $SiO_2$ by carrying out of the following steps:

Loading of substrates in a sputter deposition system;

Exhausting down to $p<5\times10^{-7}$ torr;

Ar sputtering gas admission up to $5\times10^{-3}$ torr;

Pre-sputtering of platinum target 30 minutes 300 W;

Pre-sputtering of titanium target 30 minutes 300 W;

Titanium deposition 20 nm 14 minutes 300 W, 28 rotations (application of first layer 19, FIG. 2);

Platinum deposition 39 nm 17 minutes 300 W, 34 rotations (application of second layer of electrode metal 20, FIG. 2);

Titanium deposition 5 nm 3.5 minutes 300 W, 7 rotations (application of third layer 21, FIG. 2);

Venting and unloading of substrates;

Loading of substrates in furnace;

Firing of substrates 1 hour 750° C. in $N_2/O_2$ 4:1 atmosphere;

Unloading of substrates from furnace.

A lower electrode comprising platinum with a thickness of approximately 75 nm is then present on the semiconductor surface with good adhesion. The square resistance is approximately 4 Ohms. The layer has a surface roughness of less than 0.01 micrometers.

The thickness of 20 nm for the first metal layer 19 of titanium is so chosen that a closed layer of titanium is present on the surface, sufficient titanium being available for reacting with the silicon oxide and for forming an intermetallic bond with the platinum electrode. The thickness of the second metal layer 20 comprising platinum is determined from the desired electrical conduction through the electrode. A third metal layer 21 of titanium of 5 nm thickness is sufficient to provide a closed layer of titanium oxide on the electrode surface.

The heating step is preferably carried out at approximately 750° C., a temperature which is slightly higher than that at which the ferroelectric material is fired. A good adhesion of the electrode to the subjacent material is obtained at this temperature, while at the same time the electrode is stable during firing of the ferroelectric dielectric material.

The oxygen-containing atmosphere during the heating step serves to ensure a sufficient supply of oxygen during oxidation of the third layer 21 of titanium. This condition is usually satisfied at partial oxygen pressures higher than approximately $10^{-3}$ torr.

If the third metal layer 21 of titanium is omitted in this embodiment, a lower electrode is formed after the heating stage which does have good adhesion to the silicon oxide surface, but which has a roughness of approximately 0.1 micrometer. A non-continuous, approximately 3 nm thick natural titanium oxide layer is present on the electrode surface where later the deposition of the ferroelectric dielectric material will take place. It is not possible to manufacture reliable memory elements with such an electrode. Owing to the considerable roughness, the layer thickness of the dielectric material cannot be made thin with sufficient homogeneity, while the non-continuous, very thin layer of titanium oxide can lead to contamination of the dielectric material with electrode material.

After the lower electrode has been provided, the ferroelectric dielectric material, for example lead-zirconium titanate, is provided on the electrode material. The starting material is a solution of lead ethylhexanoate, zirconium acetylacetonate, and titanium n-butoxide in n-butanol (molar concentrations approximately 0.2–0.5). This solution is applied to the lower electrode by a spinning process in a centrifuge (rotation speed between 500 and 1500 rpm). Firing takes place at approximately 700° C. for 6 hours in a furnace with an $N_2/O_2$ 4:1 atmosphere. The layer thickness of the ferroelectric material obtained in one spinning process and one firing cycle is approximately 0.1 micron. This process is carried out five times in order to obtain a desired layer thickness of approximately 0.5 microns. A typical composition of lead-zirconium titanate obtained in the process described above is $PbZr_{0.47}Ti_{0.43}O_3$.

The lower electrode and the ferroelectric dielectric material are then etched into a pattern.

An upper electrode is provided on the ferroelectric dielectric material in the same way as the lower electrode, except for the fact that the heating stage takes place at the firing temperature of the dielectric material, approximately 700° C.

After this, the upper electrode is etched into a pattern.

The capacitor created in this way is tested with a positive and a negative test voltage of 15 V. A positive and negative voltage pulse of 5 V is found to be sufficient to switch up and down between the two stable polarization states of the ferroelectric dielectric material.

EMBODIMENT 2

In a second example, a lower electrode is first provided on a semiconductor substrate, then a dielectric material is provided, after which the two are heat-treated in an oxygen-containing atmosphere, and finally an upper electrode is provided and heat-treated in an oxygen-containing atmosphere.

The application of different layers of a lower electrode takes place in analogous manner to the method of the first embodiment, except for the fact that no heat treatment at 750° C. takes place.

Subsequently, a first layer of a ferroelectric dielectric material is provided on the lower electrode by the method of embodiment 1. The heat treatments of the lower electrode and the first layer of the ferroelectric dielectric material now take place simultaneously in a furnace with an $N_2/O_2$ 4:1 atmosphere at a temperature of 700° C. for 6 hours. After this, any further layers of dielectric material are provided in the same way as in embodiment 1.

The lower electrode and the dielectric material are then etched into a pattern.

Finally, an upper electrode is provided, heat-treated and etched into a pattern in exactly the same way as in embodiment 1.

The characteristics of a capacitor obtained with embodiment 2 are identical to those obtained with embodiment 1.

Although certain techniques for depositing and shaping the electrode materials have been mentioned in the preceding text, this does not mean that the method according to the invention can only be carried out by such techniques. The electrode materials may be provided by alternative techniques such as chemical deposition from the gas phase (CVD) or electroplating, while patterning of the electrode may also be achieved, for example, by a wet-chemical etching technique.

We claim:

1. A method of manufacturing a semiconductor device of the type having memory element capacitors provided on a surface of a semiconductor body, said method comprising the steps of a) forming on said surface a lower electrode including platinum, a ferroelectric dielectric layer on said lower electrode, and an upper electrode including platinum on said ferroelectric dielectric layer, said lower electrode being formed by depositing on said surface a first layer of a metal selected from the group of titanium, zirconium, hafnium, and an alloy of these metals, by depositing on said first layer a second layer of platinum, and by depositing on said second layer a third layer of a metal selected from the group of titanium, zirconium, hafnium, and an alloy of these metals; and b) heating said semiconductor body in an atmosphere containing oxygen, such that said third layer is oxidized to form a smooth, dense, homogeneous insulating layer to enable formation of a uniform, thin ferroelectric dielectric layer.

2. A method according to claim 1, wherein said first layer of metal and said third layer of metal are both made of titanium.

3. A method according to claim 2, wherein said ferroelectric dielectric layer is deposited on said lower electrode before said step (b) so that both said lower electrode and said ferroelectric dielectric layer are heated in said atmosphere containing oxygen.

4. A method according to claim 3, wherein both said lower electrode and said ferroelectric dielectric layer are etched into a pattern after said step (b) is carried out.

5. A method according to claim 4, wherein after said lower electrode and said ferroelectric dielectric layer have been provided, said upper electrode is formed on said ferroelectric dielectric layer by depositing a first upper layer on said ferroelectric dielectric layer, said first upper layer being a metal selected from the group of titanium, zirconium, hafnium, and an alloy of these metals, by depositing a second upper layer of platinum on said first upper layer, and by depositing a third upper layer on said second upper layer, said third upper layer being a metal selected from the group of titanium, zirconium, hafnium, and an alloy of these metals, and wherein said step (b) is again carried out so that said upper electrode is formed to be smooth and have good adhesion.

6. A method according to claim 5, wherein said first upper layer is formed of the same composition as said third layer of said lower electrode so that said capacitor is formed with a symmetric voltage characteristic.

7. A method according to claim 1, wherein said ferroelectric dielectric layer is deposited on said lower electrode before said step (b) so that both said lower electrode and said ferroelectric dielectric layer are heated in said atmosphere containing oxygen.

8. A method according to claim 7, wherein both said lower electrode and said ferroelectric dielectric layer are etched into a pattern after said step (b) is carried out.

9. A method according to claim 1, wherein after said lower electrode and said ferroelectric dielectric layer have been provided, said upper electrode is formed on said ferroelectric dielectric layer by depositing a first upper layer on said ferroelectric dielectric layer, said first upper layer being a metal selected from the group of titanium, zirconium, hafnium, and an alloy of these metals, by depositing a second upper layer of platinum on said first upper layer, and by depositing a third upper layer on said second upper layer, said third upper layer being a metal selected from the group of titanium, zirconium, hafnium, and an alloy of these metals, and wherein said step (b) is again carried out so that said upper electrode is formed to be smooth and have good adhesion.

10. A method according to claim 9, wherein said first upper layer is formed of the same composition as said third layer of said lower electrode so that said capacitor is formed with a symmetric voltage characteristic.

11. A method according to claim 10, wherein said first layer of metal and said third layer of metal are both made of titanium.

* * * * *